(12) United States Patent
Myland

(10) Patent No.: US 6,907,890 B2
(45) Date of Patent: Jun. 21, 2005

(54) CAPILLARY DRYING OF SUBSTRATES

(75) Inventor: Lawrence J. Myland, West Chester, PA (US)

(73) Assignee: Akrion LLC, Allentown, PA (US)

( * ) Notice: Subject to any disclaimer, the term of this patent is extended or adjusted under 35 U.S.C. 154(b) by 139 days.

(21) Appl. No.: 10/358,636

(22) Filed: Feb. 5, 2003

(65) Prior Publication Data

US 2003/0145874 A1 Aug. 7, 2003

Related U.S. Application Data

(60) Provisional application No. 60/354,812, filed on Feb. 6, 2002.

(51) Int. Cl.[7] .................................................. B08B 7/00
(52) U.S. Cl. .............................. 134/25.1; 134/2; 134/6; 134/18; 134/25.4; 134/25.5; 134/95.2; 134/104.2; 134/137
(58) Field of Search ................................ 134/2, 6, 7, 8, 134/9, 18, 25.1, 25.4, 34, 25.5, 32, 49, 95.2, 104.1, 104.2, 137, 44; 294/64.1, 64.3

(56) References Cited

U.S. PATENT DOCUMENTS

| | | | |
|---|---|---|---|
| 4,318,749 A | * | 3/1982 | Mayer ...................... 134/25.4 |
| 4,984,597 A | | 1/1991 | McConnell et al. |
| 5,571,337 A | | 11/1996 | Mohindra et al. |
| 6,125,554 A | | 10/2000 | Munakata |
| 6,254,155 B1 | | 7/2001 | Kassir |
| 6,488,040 B1 | * | 12/2002 | de Larios et al. .......... 134/95.2 |

* cited by examiner

Primary Examiner—Randy Gulakowski
Assistant Examiner—Gentle E. Winter
(74) Attorney, Agent, or Firm—Michael B. Fein, Esq.; Brian L. Belles, Esq.; Cozen O'Connor, P.C.

(57) ABSTRACT

An apparatus and method for drying substrates. The inventive apparatus comprises: an object support member for supporting at least one substrate in a process tank having one or more support sections comprising capillary material. The inventive method is a method of removing liquid from a wet substrate in a process tank comprising contacting the wet substrate with capillary material. In another aspect, the invention is a method of drying at least one substrate having a surface in a process tank comprising: submerging the substrate in a liquid having a liquid level; supporting the submerged substrates in the process tank; supplying a drying vapor above the liquid level; lowering the liquid level or raising the substrate so that the liquid level is below the substrate, thereby removing a major portion of liquid from the substrate surface; and removing remaining liquid from the substrate surface with capillary material.

21 Claims, 6 Drawing Sheets

CAPILLARY DRYING OF SUBSTRATES

CROSS-REFERENCE TO RELATED APPLICATION

Benefit of Provisional Application No. 60/354,812 filed Feb. 6, 2002, is claimed.

TECHNICAL FIELD OF THE INVENTION

The present invention relates to apparatus and processes for drying objects, especially silicon wafer substrates, flat panel display substrates, and other types of substrates which must be cleaned, rinsed, and dried during the manufacture of a device. The invention especially relates to removing remaining amounts of liquid from silicon wafer substrates during the manufacture of integrated circuits.

BACKGROUND ART

In the manufacture of semiconductors, semiconductor devices are produced on thin disk-like substrates. Generally, each substrate contains a plurality of semiconductor devices. The exact number of semiconductor devices that can be produced on any single substrate depends both on the size of the substrate and the size of the semiconductor devices being produced thereon. However, semiconductor devices have been becoming more and more miniaturized. As a result of this miniaturization, an increased number of semiconductor devices can be produced for any given area, thus, making the surface area of each substrate more and more valuable.

In producing semiconductor devices, substrates are subjected to a multitude of processing steps before a viable end product can be produced. These processing steps include: chemical-etching, wafer grinding, photoresist stripping, and masking. These steps typically occur in a process tank and often require that each substrate undergo many cycles of cleaning, rinsing, and drying during processing so that particles that may contaminate and cause devices to fail are removed from the substrates. However, these rinsing and drying steps can introduce additional problems in of themselves.

One major problem is the failure of the drying step to completely remove liquid from the substrates after rinsing (or any other processing step where the substrate is exposed to a liquid). It is well known in the art that those semiconductor devices that are produced from an area of the substrate where liquid droplets remained have a greater likelihood of failing. Thus, in order to increase the yield of properly functioning devices per substrate, it is imperative that all liquid be removed from the substrate surface as completely as possible.

Very sophisticated systems and methods have been devised to dry substrates as quickly and as completely as possible. However, due to deficiencies of prior art systems and methods of drying it is impossible to completely remove all traces of liquid from the substrate surfaces in an efficient and inexpensive manner. When substrates are placed in a tank for processing, the substrates are typically supported in an upright position by a support device which can be a carrier or an object support member that is built into the process tank itself. It is a well recognized problem in the art to quickly and effectively remove traces of water from those areas of the substrate that are in contact with the supporting device. Therefore, there is a certain very valuable portion of the substrate which is wasted due to what is known in the art as "edge exclusion," a term referring to the portion of the substrate near the edges which cannot be completely dried and must be discarded. Because semiconductor devices are becoming more miniaturized, the "edge exclusion" areas are also becoming more valuable in that an increased number of functioning devices would be able to be produced from these areas if it were not for the water-spotting caused by the remaining amounts of liquid.

There have been many attempts to improve dryer systems and drying methods so as to eliminate the need for edge exclusion by completely drying the wafer substrate. However, none have fully solved the problem in an effective and efficient manner.

For example, Mohindra, et al., U.S. Pat. No. 5,571,337, teaches pulsing a drying fluid such as nitrogen gas at the edge of the partially completed semiconductor to remove the liquid from the edge. Application of the Mohindra process results in evaporation of the liquid at the contact points. Evaporation is undesirable because particles or non-purities that may have been present in the water are left behind, both of which decrease yields. Moreover, the equipment necessary to perform the Mohindra process can be expensive and cumbersome.

McConnell, et al., U.S. Pat. No. 4,984,597, teaches using large amounts of IPA to replace water and enhance drying. However, such a process requires special tanks and elaborate support equipment to safely handle and process the IPA. Additionally, the McConnell process is costly due to the large amounts of IPA used.

A third drying system is taught by Munakata in U.S. Pat. No. 6,125,554. Munakata teaches a system for drying substrates comprising a rack having grooves for supporting substrates in a vertical position. The substrates are contacted and supported in the grooves of the rack. Each groove has an aperture near the groove that is capable of sucking water that adheres to the substrate near the groove contact point into the aperture. This system requires additional equipment to create a vacuum force at each groove and the open apertures and cavities within the rack can present problems in a liquid filled process tank because of air bubbles and trapped particles. Additionally, the rack used in Munakata can be both expensive and difficult to manufacture.

Many other systems and methods have been proposed to try to solve the edge exclusion problem resulting from the inability to efficiently remove water residue from the contact points between the edges of substrates and the supporting devices of dryers in a clean, low cost, and timely manner, but none have completely solved the problem.

DISCLOSURE OF INVENTION

It is therefore an objective of the present invention to provide a quicker method of drying high value objects, such as substrates.

A further objective of the present invention is to provide a more cost-effective method of drying high value objects.

A yet further objective of the present invention is to reduce or eliminate the problem of edge exclusion that exists at contact points between dryer equipment and the objects being dried.

A still further objective is to improve yields of high value integrated circuits from silicon wafers.

Yet another objective of the present invention is to reduce the need for great amounts of expensive drying chemicals.

Additional objects and advantages of the invention will be set forth in the description that follows and will become apparent to those skilled in the art upon examination of the following or may be learned with the practice of the invention. The objects and advantages of the invention may be realized and obtained by means of the instrumentalities and combinations particularly pointed out in the claims.

In one aspect the invention is an apparatus for use in drying at least one substrate comprising: an object support member for supporting at least one substrate in a process tank having one or more support sections comprising a capillary material. It is preferable that all of the one or more support sections comprise the capillary material.

In one embodiment, the object support member is constructed entirely of the capillary material. However, it is preferable that the object support member comprise a core constructed of the capillary material and a shell constructed of a non-capillary material. In this embodiment, the support sections comprise grooves extending through the shell and exposing the core. The substrate will be supported in the grooves in a substantially upright position. It is further preferable that the one or more grooves comprise downwardly angled walls. This embodiment will minimize the contact area between the substrate and the object support member when a substrate is supported by the object support member, providing a less-obstructed path for fluid flow. The non-capillary material of the shell is preferably a non-porous flouropolymer, such as PP or PTFE.

It is preferable that the support sections of the object support member be adapted so that when a substrate is supported by the object support member, the substrate only contacts the capillary material.

The apparatus can further comprise a drain fluidly connected to the capillary material. As liquid is drawn into the capillary material, liquid will drain out of another portion of the capillary material and into the drain, making room for additional liquid to be drawn into the capillary material. The drain can be kept at ambient pressure so as to not require a vacuum or other expensive equipment. In another embodiment, the drain can be fluidly connected to a vacuum source adapted to draw liquid into the capillary material or to force liquid through the capillary material and into the process chamber. Preferably, the vacuum source is adapted to force deionized rinse water through the capillary material and into the process tank prior to and during the process tank being filled with the deionized water in which the substrates will be submerged. This will re-wet the capillary material and eliminate any air pockets in the capillary material.

If the apparatus is used in a process tank that is adapted to chemically treat substrates in addition to rinsing and drying, the vacuum source can be further adapted to draw liquid from the process tank and into the capillary material when the process tank is filled with chemicals and clean deionized rinse water begins to be introduced into the process tank. By drawing liquid into the capillary material at this time, chemicals that may be trapped in the capillary material will be pulled further into the capillary material and replaced by the inflowing deionized rinse water. This will prohibit trapped chemicals from defusing back into the process tank and over etching those portions of the substrate contacting the capillary material.

While the capillary material can be any material that is capable of drawing in liquid through the use of capillary forces, it is preferred that the capillary material be a porous flouropolymer, such as porous polypropylene ("PP") or porous polytetraflouroethylene ("PTFE").

In one embodiment, the object support member comprises two outside lifters, a center lifter, and a base plate. In this embodiment, the outside lifters and center lifter extend upward from the base plate and the center lifter is shorter than the two outside lifters. The outside lifters and center lifter should be positioned on the base plate so that the outside lifters and shorter center lifter can engage and support a substrate as it is lowered into the process tank.

The object support member can be adapted to contact and support a plurality of objects during a drying process. It is also preferable that the object supporting member be in a fixed position at or near the bottom of the process tank.

In another aspect, the invention is a method of removing liquid from a wet substrate in a process tank comprising contacting the wet substrate with a capillary material.

In yet another aspect, the invention is a method of drying at least one substrate having a surface in a process tank comprising: submerging the substrate in a liquid having a liquid level; supporting the submerged substrates in the process tank; supplying a drying vapor above the liquid level; lowering the liquid level or raising the substrate so that the liquid level is below the substrate, thereby removing a major portion of liquid from the substrate surface; and removing remaining liquid from the substrate surface with a capillary material.

In one embodiment of the inventive method, the step of removing liquid with a capillary action will comprise contacting the substrate with the capillary material subsequent to the lowering or raising step. However, the capillary material is preferably part of an object support member that supports the substrate.

The method can further comprise the step of draining the liquid that is drawn into the capillary material through a drain that is fluidly connected to the capillary material. This draining step is preferably performed at atmospheric pressure.

Sealing the process tank and performing the above steps in a closed atmosphere is preferred. The closed atmosphere is preferably an inert atmosphere. Upon the process tank being sealed, the drying vapor is supplied to the process tank above the liquid level while the at least one substrate is submerged in the liquid. The liquid can be deionized water and the drying vapor can comprise isopropyl alcohol. The isopropyl alcohol will defuse into the liquid surface of the deionized water. As the liquid is drained from the process tank and the liquid level is lowered passed the substrates, the Marangoni Drying effect will remove a majority of the liquid from the substrates surfaces. However, this Marangoni-style drying is incapable of completely drying the substrates. The liquid that remains on the substrates usually must be removed by the substrate being in contact (or being contacted) with the capillary material to draw remaining liquid off the substrate and into the capillary material through capillary force.

Before the inventive drying method is performed on the substrates, it is preferable any air pockets that may be trapped in the capillary material be eliminated. Elimination of these air pockets is preferably achieved by forcing a liquid, preferably deionized water, into the process tank through the capillary material. This re-wetting procedure is performed prior to the substrates being introduced to the process tank.

The inventive methods of the present application can be used in conjunction with a multitude of semiconductor processing steps, including etching, rinsing, and stripping. In many cases, all of these steps can be performed in a single process tank with the substrates being in-situ the entire time.

MODES FOR CARRYING OUT THE INVENTION

The figures and following description describes embodiments of the present invention for purposes of illustration only. Those skilled in the art will readily recognize from the following discussion that alternative embodiments of the structures and methods illustrated herein may be employed without departing from the principles of the invention.

Figure 1:
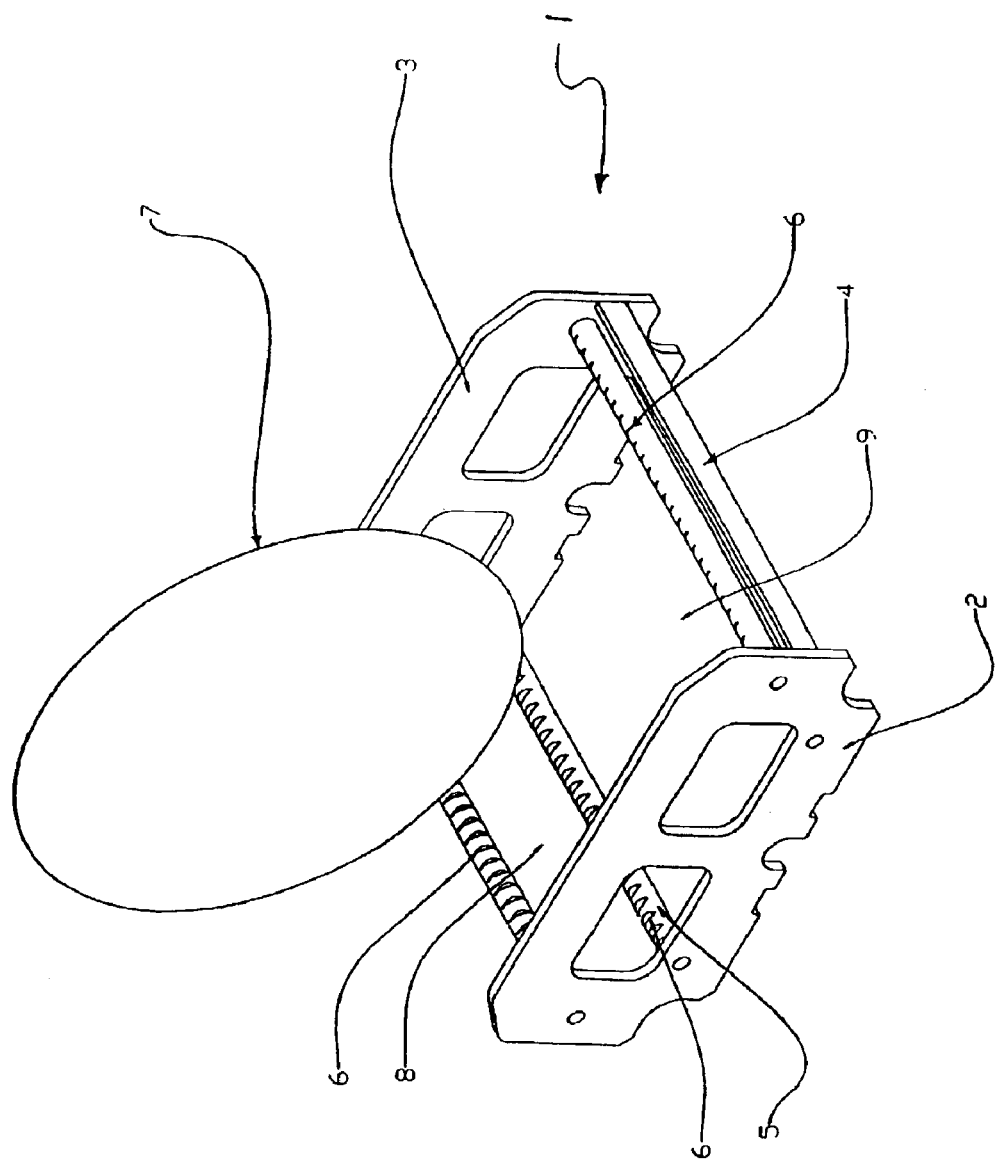
FIG. 1 is a perspective view of an embodiment of a substrate carrier with a substrate being lowered therein.

Referring to FIG. 1, an embodiment of substrate carrier 1, also known as a wafer basket, is illustrated. Substrate carriers are typically used in the semiconductor industry to transport substrates through the manufacturing process from machine to machine. Using substrate carriers reduces or eliminates the need for substrates to be handled directly by machine operators, thus reducing the likelihood of physical damage or contamination. Substrate carrier 1 has a front panel 2, a rear panel 3, two side panels 4, two bottom support panels 5, and a plurality of substrate separating guides 6 protruding from both side panels 4 and bottom support panels 5. The substrate separating guides 6 are aligned so that a flat substrate 7 can be slidably placed between and supported by said substrate separating guides 6.

Figure 2:
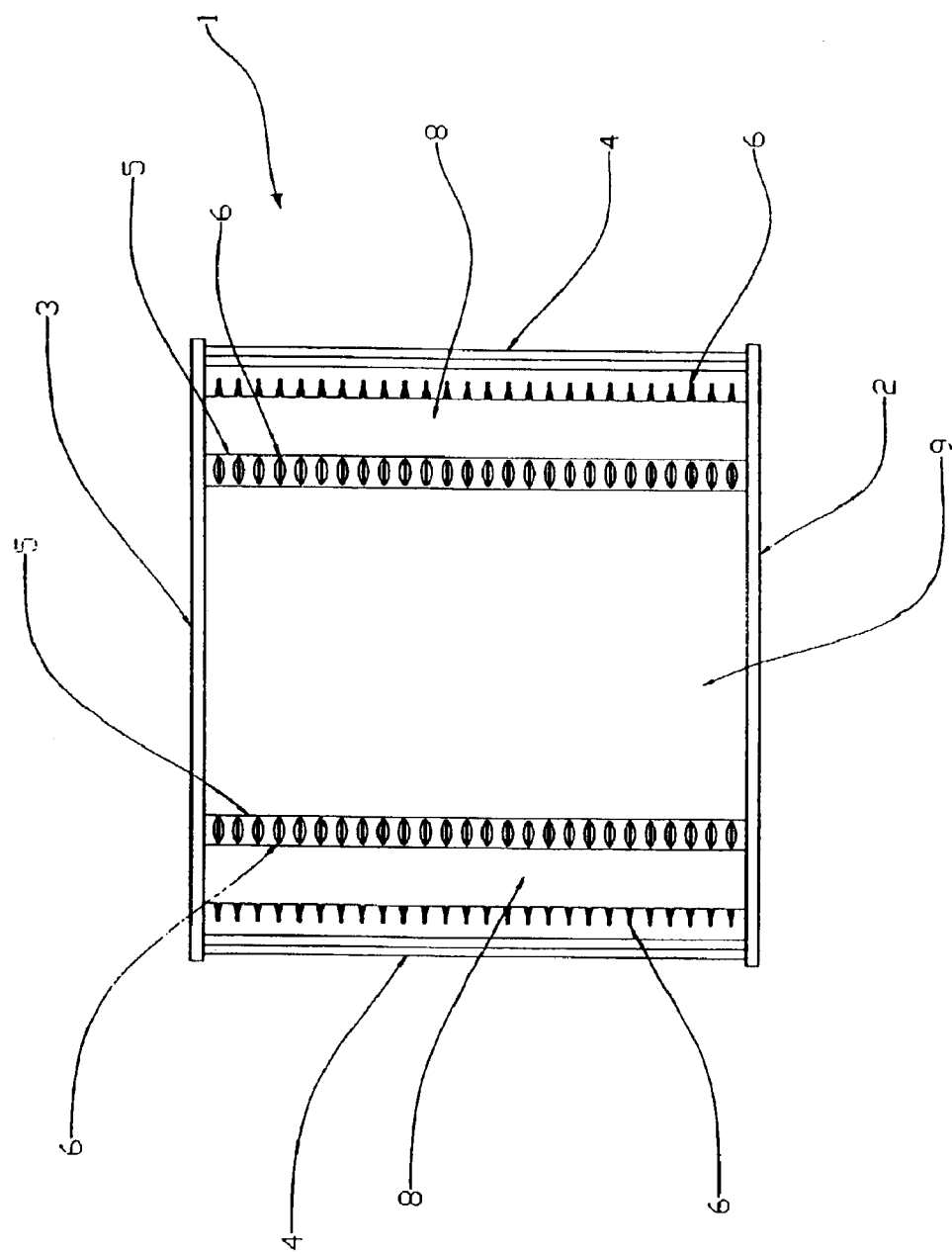
FIG. 2 is a top view of the substrate carrier of FIG. 1.

Referring now to FIG. 2, substrate carrier 1 also has two side opening holes 8 and a bottom opening hole 9. While substrate carrier 1 is illustrated as a wafer basket having the above design features, those skilled in the art will appreciate that the present invention is not limited by this embodiment. A substrate carrier can take on any form so long as it is capable of carrying at least one substrate and can perform the functions described in the claims. Alternative embodiments can include robot arms adapted to engage and transport substrates, wire-frame substrate carriers, and suction wands.

Figure 3:
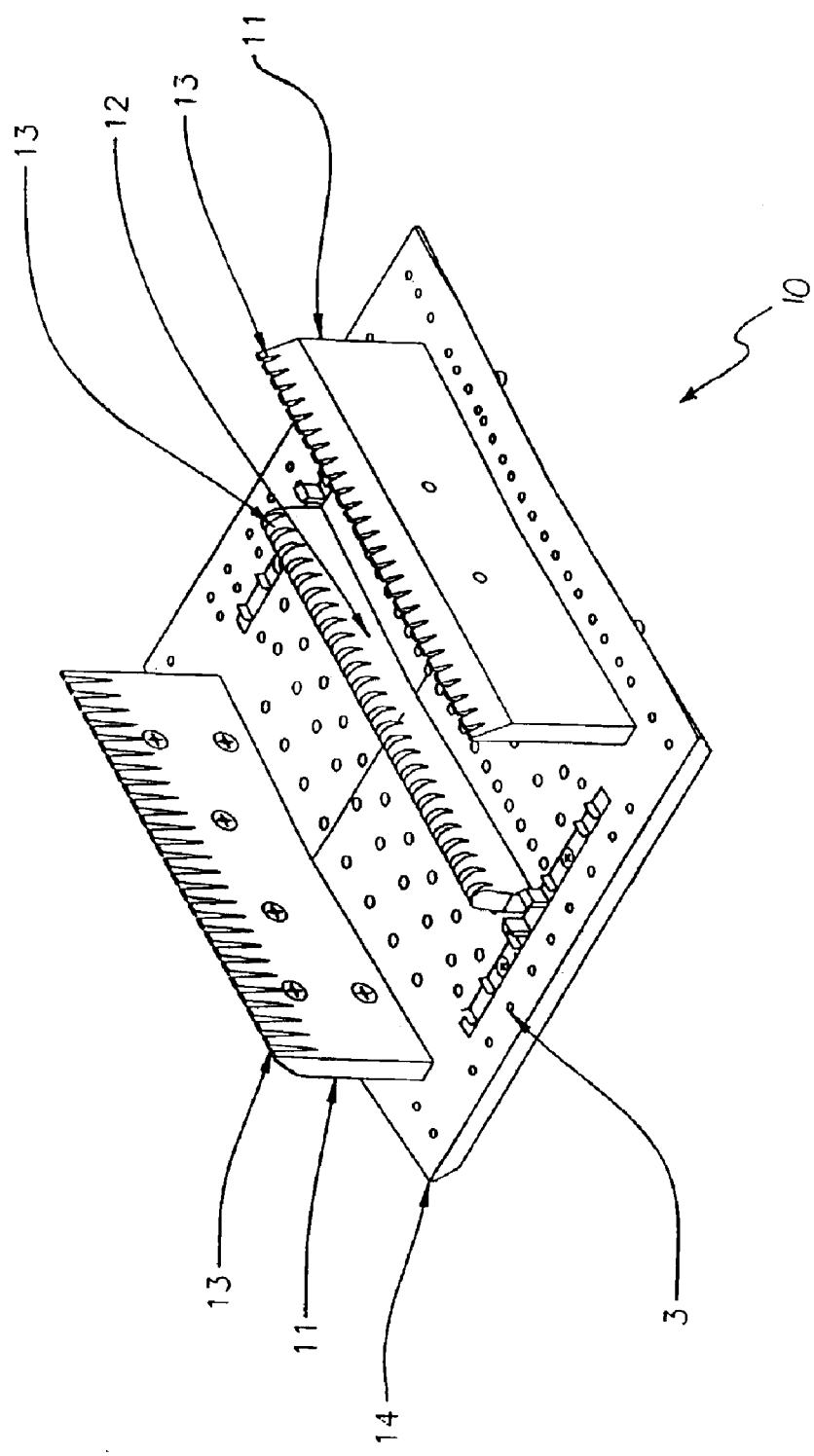
FIG. 3 is a perspective view of an embodiment of an object support member according to the present invention.
Figure 4:
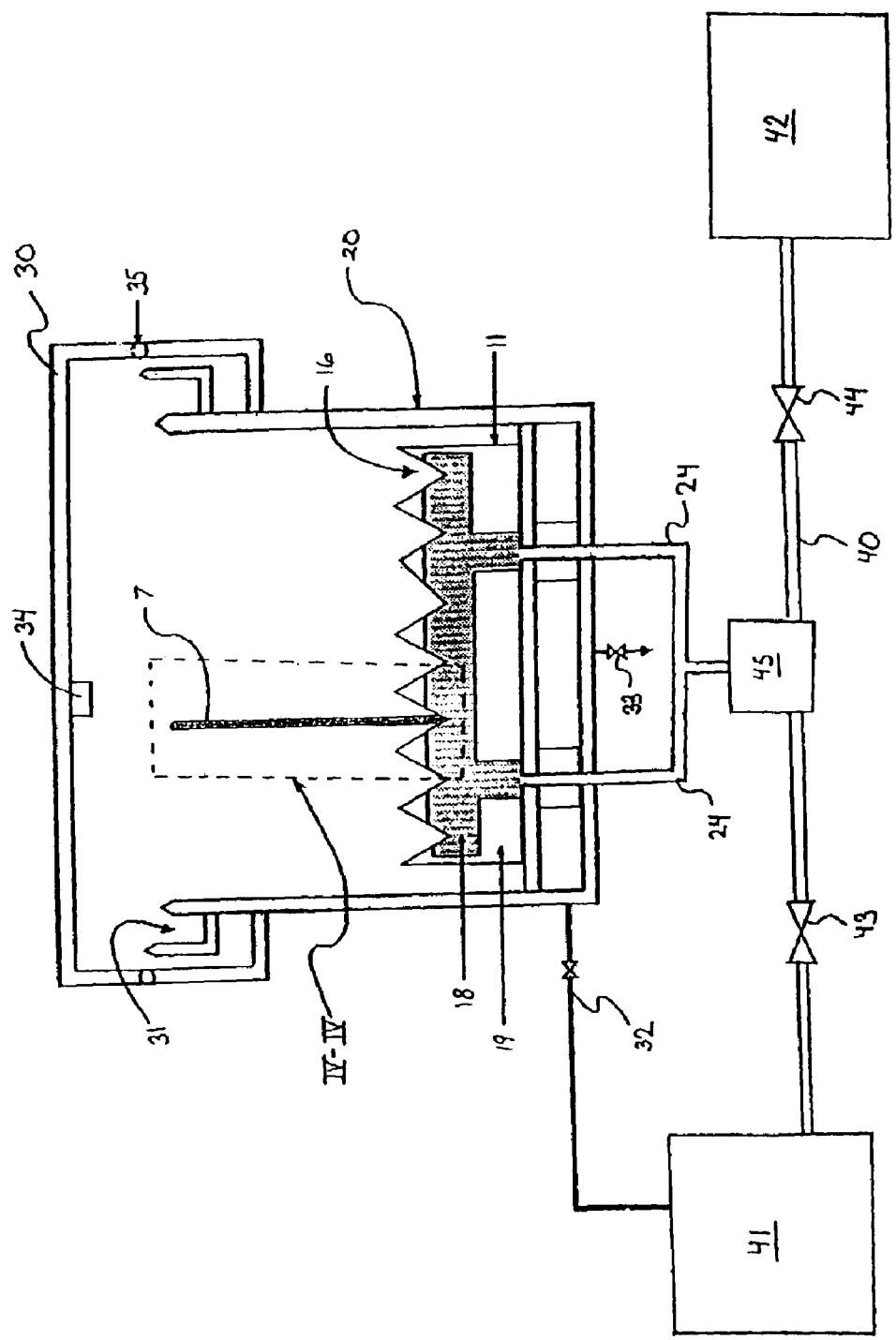
FIG. 4 is a side cross-section schematic view of the object support member of FIG. 3 positioned in a process tank and supporting a substrate.

FIG. 3 illustrates an embodiment of object support member 10 according to the present invention. Object supporting member 10 comprises two outside lifters 11, shorter center lifter 12, and base plate 14. Base plate 14 has a plurality of holes 15 located throughout the base plate 14 to facilitate drainage of liquid from object support member 10. When a source of incoming fluid is located below base plate 14, holes 15 also facilitate uniform distribution of the incoming fluid into process tank 20 (FIG. 4). Both the outside lifters 11 and center lifter 12 are constructed so as to have a plurality of jagged substrate holding combs 13 along the top portion of each outside lifter 11 and center lifter 12. Substrate holding combs 13 form consecutive upside-down triangularly shaped grooves 16 (FIG. 4) that act as the support sections of object support member 10. While the support sections of object support member 10 are illustrated as grooves 16, the support sections of an object support member are not so limited and can take on any embodiment so long as they are capable of supporting a substrate.

Referring to FIGS. 3 and 4, grooves 16 are formed so to be capable of receiving and supporting substrate 7 therein, functioning as the support sections of object support member 10. Grooves 16 are aligned on outside lifters 11 and center lifter 12 so that a flat substrate 7 can be inserted into corresponding grooves 16 of outside lifters 11 and center lifter 12. Substrate 7 will be supported in a substantially vertical position with minimal contact between object support member 10 and substrate 7. While object support member 10 is illustrated as being designed to support a plurality of substrates, the present invention is not so limited and can encompass object support members designed to support a single substrate, so long as the limitations set forth in the claims are met.

Referring to FIG. 4, object support member 10 is preferably positioned at or near the bottom of process tank 20. As illustrated, object support member 10 comprises a core 18 and a shell 19. Core 18 is constructed of a capillary material (shaded) while shell 19 is constructed of a non-capillary material. Specifically, core 18 is constructed of porous polypropylene ("PP") and shell 19 is constructed of non-porous polyvinylidene fluoride ("PVDF"). As used herein, a "capillary material" is any material that is capable of drawing in liquid as a result of capillary forces and includes both closed cell materials with pores/cavities and open cell materials with spaces/voids between its mass. A material can inherently be a capillary material or can be altered so as to exhibit capillary abilities, such as for example by making the material porous. The term "non-capillary material," as used herein, means any material that does not exhibit a significant ability to draw liquid into it through capillary forces.

Preferred examples of capillary materials that can be used in practicing the present invention are porous flouropolymers, such as PP, polytetraflouroethylene ("PTFE"), and PVDF. Acceptable pore size for the porous PP used is in the range of 125 to 170 microns. Acceptable pore volume of the porous PP ranges between 35–50%. This means that 35–50% of the volume of the porous PP is open air. While porous PP and porous PTFE are the preferred capillary materials to be used in the present invention, those skilled in the art will understand that the term capillary material encompasses a much broader range of materials, including materials not yet known or discovered, so long as these materials exhibit the ability to draw liquid in through the capillary force phenomenon. When used in forming an object support member, the capillary material must also be rigid enough to support substrates.

Examples of suitable non-capillary materials include non porous flouropolymers, such as PP, PTFE, and PVDF.

While a cross section of outside lifter 11 is illustrated in FIG. 4, it should be understood that center lifter 12 and the other outside lifter 11 (FIG. 3) are constructed in a similar fashion with respect to core 18 and shell 19. Grooves 16 extend through shell 19 into core 18, exposing the capillary material that is core 18. When substrate 7 is supported in object supporting member 10, substrate 7 is slidably inserted downward into grooves 16 until substrate 7 engages the capillary material of core 18 without contacting the non-capillary material of shell 19. Thus, substrate 7 is supported by object supporting member 10 so that substrate 7 contacts only the capillary material of object supporting member 10.

The capillary material of core 18 is fluidly connected to drain lines 24. This allows liquid that is drawn into the capillary material of core 18 to drain away from substrate 7 and out of process tank 20. Drain lines 24 are fluidly connected to fluid line 40 through vacuum source/eductor 45. Fluid line 40 is also fluidly connected to deionized water supply 41 on one end and drain reservoir 42 on the opposite end. Fluid line 40 has first valve 43 positioned between deionized water supply 41 and vacuum source/eductor 45. Drain line 40 also has second valve 44 positioned between vacuum source/eductor 45 and drain reservoir 42.

Drainage of the capillary material will occur at ambient pressure during the removal of liquid by capillary action. The use of a vacuum source/eductor 45 is not required. While not necessary to practice the invention, it has been discovered that it is desirable to have vacuum source/eductor 45 incorporated into the system as illustrated. By properly adapting vacuum source/eductor 45, it can be ensured that the capillary material will be fully saturated with liquid during processing and that trapped chemicals do not contact the substrates 7 at undesirable times. Trapped air is undesirable because such air can cause air bubbles to come out of the capillary material and contact wafers that are in the process tank 20. These air bubbles can carry contaminants, such as particles, that can be deposited onto the wafers when the air bubbles contact the wafers. Adequately saturating the capillary material will remove any air that is trapped in the capillary material.

Process tank 20 comprises lid 30, overflow weir 31, liquid supply line 32, chamber drain 33, and drying vapor source 34. Lid 30 connects to process tank 20 in a conventional manner and is capable of forming a sealed atmosphere within the process chamber by virtue of O-rings 35 located where lid 30 contacts the top of process tank 20. Liquid supply line 32 can be adapted to be capable of supplying any process liquid to process tank 20, including deionized water, chemicals, mixtures, and solutions. All of the elements of process tank can be controlled manually or can be automated through the use of a properly programmed processor.

Figure 5:
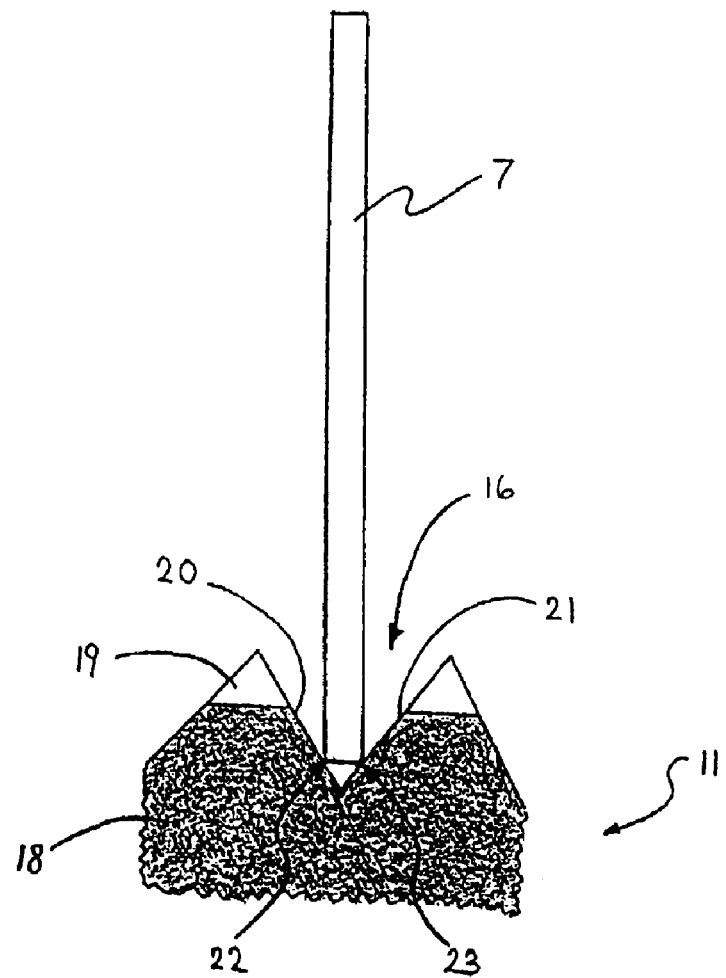
FIG. 5 is an enlarged view of area IV—IV of FIG. 4.

Referring to FIG. 5, a close-up view of the area of contact between substrate 7 and groove 16 of outside lifter 11 is shown according to one embodiment of the present invention. When substrate 7 is inserted into groove 16, substrate 7 contacts and engages side walls 20, 21 of groove 16, forming contact points 22, 23.

Contact points 22, 23 are located on sidewalls 20, 21, below shell 19 which is made of a non-capillary material, such as non-porous PP or PTFE. Contact points 22, 23 are located on those parts of sidewalls 20, 21 that are constructed of the capillary material that is core 18. By ensuring that substrate 7 contacts only those points/areas of object support member 10 that are constructed of a capillary material, liquid that gets trapped on substrate 7 at or near the contact points 22, 23 is pulled into the capillary material by capillary forces. While grooves 16 are illustrated as upside-down triangularly shaped cavities, grooves 16 can be designed so as to be any shape that will support a substrate 7 therein, such as rectangular or semi-circular. However, by shaping grooves 16 triangularly, the area of contact that exist between object support member 10 and substrate 7 is minimized.

While FIG. 5 specifically illustrates the contact of substrate 7 with outside lifter 11, when substrate 7 is supported in object support member 10, substrate 7 also contacts center lifter 10 and the other outside lifter 11 in a similar fashion (FIG. 3). Thus, when a substrate 7 is being supported by object support member 10, each of the two outside lifters 11 and the center lifter 12 engage and support substrate 7 as illustrated in FIG. 5. While the illustrated embodiment shows object support member 10 comprising a core 18 made of a capillary material, such as porous PP or PTFE, and a shell 19 made of non-capillary material, it is possible to construct the entire object support member out of a capillary material, or to design the object support member so that only the support sections are constructed of the capillary material.

Moreover, while substrate 7 is illustrated as having a rectangular profile so that substrate 7 forms only two contact points 22, 23 with outside lifter 11, it is possible for substrate 7 to take on a variety profiles, especially near the substrate edge. Changing the edge profile of the substrate can change the number of contact points created between the substrate 7 and the object support member 10, thus forming a contact area.

Figure 6:
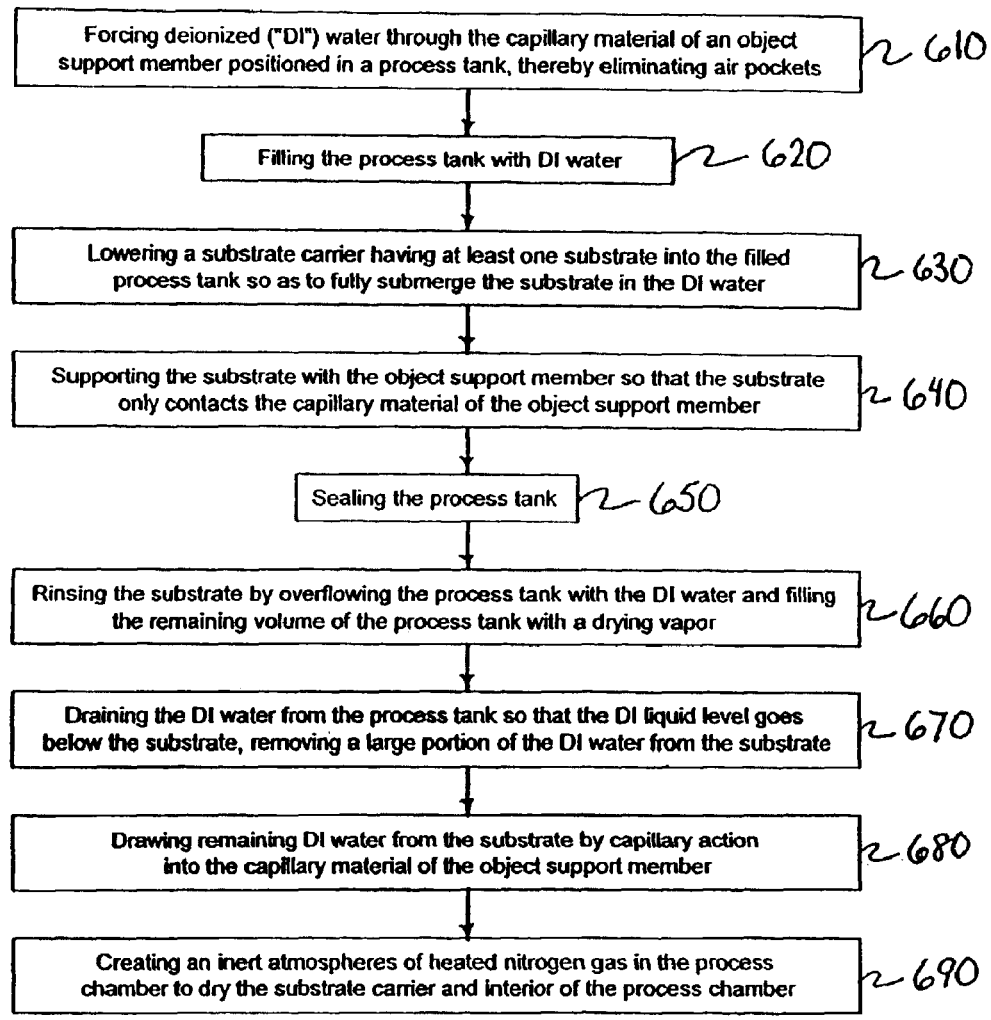
FIG. 6 is a flowchart of an embodiment of a method of drying a substrate according to the present invention.

FIG. 6 summarizes the steps performed in practicing one embodiment of the claimed method of drying. The steps of FIG. 6 will be discussed in relation to the apparatus shown in FIGS. 1–5.

At the start of the drying process, process tank 20 is empty and lid 30 is open. Second valve 44 is closed, prohibiting fluid to flow there through. First valve 43 is open, allowing deionized ("DI") water from DI water supply 41 to flow through fluid line 40 and into vacuum source/eductor 45. Vacuum source/eductor 45 is filled and the DI water is forced into drain lines 24, through the capillary material of core 18, and into process tank 20, thus completing step 610. Re-wetting the capillary material eliminates any air pockets that may be trapped in the capillary material before substrates 7 are introduced into process tank 20.

Concurrently with the forcing of DI water through the capillary material of core 18, DI water is also supplied to process tank 20 from DI water supply 41 through liquid supply line 32. Once the liquid level of the DI water is above the exposed capillary material, the forcing of the DI water through the capillary material of core 18 can be ceased by deactivating vacuum source/eductor 45. Second valve 44 is opened and first valve 43 can be closed. DI water continues to be supplied to process tank 20 through liquid supply line 32 until the DI water fills process tank 20 and cascades into overflow weir 31, completing step 620.

DI water continues to be supplied to process tank 20, causing overflow of the DI water for a determined period of time so as to ensure adequate removal of any particles or contaminants that may be in process tank 20. Once process tank 20 is deemed to be adequately clean, substrate carrier 1 with at least one substrate 7 therein is lowered into filled process tank 20, completing step 630. The DI water may or may not be cascading over the walls of process tank 20 into overflow weir 31 at this time.

The lowering of wafer basket 1 into process tank 20 is continued until outside lifters 11 and center lifter 12 of object support member 10 respectively extend through the two side opening holes 8 and bottom opening hole 9 of substrate carrier 1. As the outside lifters 11 and center lifter 12 extend through the two side opening holes 8 and bottom opening hole 9, the outside lifters 11 and center lifter 12 engage and support any substrates 7 that are in substrate carrier 1. As substrate carrier 1 continues to be lowered, substrates 7 are removed from and are no longer in contact with any part of substrate carrier 1. The substrates 7 are captured in corresponding grooves 16 of outside lifters 11 and center lifter 12 (as demonstrated in FIG. 5). At this point, the substrates 7 are supported solely by object support member 10 and in contact with the capillary material of core 18 only, thus completing step 640.

Tank lid 30 is then closed, sealing process tank 20 and completing step 650.

During step 660, DI water is continued to be supplied to process tank 20 via process liquid supply line 32. The continued supply of DI water flows past the surfaces of the supported substrates 7.

Once the substrates 7 have been adequately rinsed, the DI water supply is stopped. At this point, substrates 7 are fully submerged below the liquid level of the DI water and are completely wet and need to be dried before further processing.

The remaining volume of the sealed process tank 20 is filled with a drying vapor, preferably consisting of isopropyl alcohol ("IPA") and a nitrogen gas, completing step 660. The drying vapor is introduced to process tank 20 via drying vapor source 34 which is located above the liquid level of the DI water. Drying vapor source 34 can be any type of apparatus or system known in the art to generate drying vapor, such as spray nozzles, bubblers, evaporators, etc. As the drying vapor is supplied to process tank 20, IPA diffuses into the top of the DI water level.

Chamber drain 33 is then opened, allowing the DI water with the IPA diffusing therein to drain from process tank 20. As the DI water drains from process tank 20, the liquid level of the DI water passes below substrates 7, removing a majority of the DI water from the substrate surfaces via the Marangoni drying effect, thus completing step 670. Chamber drain 33 is fluidly connected to a suitable reservoir, possibly by fluid line 40. The rate at which the DI water, including the diffused IPA, is drained will depend on the specific design requirements of the substrates being processed and the process tank being used. However, a drop rate in the range of 0.5 mm to 5.0 mm per second has been found to be suitable. Controlling the rate of the liquid level drop to properly facilitate Marangoni Drying is well known in the art and can be easily determined by one skilled in the art. Once the liquid level of the DI water and diffusing IPA is below the supported substrates 7, a majority of the DI water is removed from the surface of the substrates. However, this type of Marangoni drying can not by itself adequately dry the substrates, leaving DI water on the substrate surfaces at or near those points/areas of the substrate 7 that are in contact with object support member 10. Alternatively, the liquid level of the DI-water can be maintained and the substrates can be raised above the DI water liquid level.

Because the support sections (i.e. the grooves 16) of object support member 10 are constructed of a capillary material, the DI water remaining on the substrate 7 surface at or near the contact points 22, 23 are drawn off substrate 7 and into the capillary material by capillary forces, completing step 680.

Alternatively, the substrates 7 can be supported in process tank 20 by a support device constructed of non-capillary material at the support sections. In this embodiment, the DI water remaining on the substrate surface is drawn off substrate 7 by contacting the remaining liquid with a capillary material element, such as a wick-type structure. This will draw the remaining DI water into the capillary material by capillary forces. The inventive method is not limited to any particular structure, so long as liquid that remains on the substrates is removed by capillary action.

As the capillary material of core 18 draws DI water into it through capillary force, DI water that is already trapped in the capillary material drains into drain line 24, making room for additional DI water to be drawn in. Drain line 24 is kept at ambient pressure at this time, allowing the absorbed DI water to drain out of the capillary material without the use of negative pressure.

Upon the DI water being dried from substrates 7 as described above, the IPA supply is ceased and process tank 20 becomes completely filled with heated nitrogen gas, forming an inert atmosphere in sealed process tank 20, completing step 690. This heated nitrogen gas facilitates drying of the substrate carrier 1 and other parts of process tank 20. However, this hot nitrogen does not dry the substrates because all or substantially all of the liquid has been removed from the substrates at this time. The substrates are then removed from process tank 20.

It is possible to further adapt process tank 20 to supply chemicals and other chemistries through liquid supply line 32 for rinsing, etching, or stripping substrates 7 in an in-situ process. When process tank 20 is so adapted, there is the possibility that the capillary material will absorb some of these chemicals. In order to avoid these chemicals from diffusing out of the capillary material and contacting the substrates 7 at a later time, vacuum source/eductor 45 can be adapted to draw liquid into the capillary material for a period of time as the DI rinse water begins to replace the chemicals. Alternatively, this vacuum force can be created by opening first valve 43 and second valve 44.

While the invention has been described and illustrated in detail, various alternatives and modifications will become readily apparent to those skilled in the art without departing from the spirit and scope of the invention. Particularly, the apparatus and method of invention are not limited to removing DI water after a rinse step but can be used to remove any liquid from the substrate. Furthermore, the present invention is as equally applicable to single-water processing systems and apparatus as it is to batch processing systems and apparatus.

What is claimed is:

1. An apparatus for use in drying at least one substrate comprising:
    an object support member for supporting at least one substrate in a process tank having one or more support sections comprising cellular capillary material, the object support member comprising a core constructed of cellular capillary material and a shell constructed of non-capillary material, the object support member further comprising grooves extending through the shell and exposing the cellular core.

2. The apparatus of claim 1 wherein all of the one or more support sections comprise cellular capillary material.

3. The apparatus of claim 1 wherein the object support member is constructed entirely of cellular capillary material.

4. The apparatus of claim 1 wherein the grooves have angled walls.

5. The apparatus of claim 4 wherein the non-capillary material is a non-porous flouropolymer.

6. The apparatus of claim 5 wherein the non-porous flouropolymer is selected from the group consisting of PP, PTFE, and PVDF.

7. The apparatus of claim 1 wherein the support sections are adapted to support substrates by contact with the cellular capillary material exclusively.

8. The apparatus of claim 1 further comprising a drain fluidly connected to the cellular capillary material.

9. The apparatus of claim 1 wherein the object support member comprises two outside lifters, a center lifter, and a base plate; the outside lifters and center lifter extending upward from the base plate; the center lifter being shorter than the two outside lifters; the outside lifters and center lifter being positioned on the base plate so that the outside lifters and center lifter can engage and support the at least one substrate.

10. The apparatus of claim 1 wherein the object support member is adapted to contact and support a plurality of substrates.

11. The apparatus of claim 1 wherein the object support member is in a fixed position at or near the bottom of the process tank.

12. An apparatus for use in drying at least one substrate comprising:

an object support member for supporting at least one substrate in a process tank having one or more support sections comprising cellular capillary material; and wherein the cellular capillary material is a porous fluoropolymer.

13. The apparatus of claim 12 wherein the porous flouropolymer is selected from the group consisting of PP, PTFE, and PVDF.

14. A method of drying at least one substrate having a surface in a process tank comprising:

submerging the substrate in a liquid having a liquid level;

supporting the submerged substrates in the process tank with an object support member having one or more support sections comprising cellular capillary material;

supplying a drying vapor above the liquid level;

lowering the liquid level or raising the substrate so that the liquid level is below the substrate, thereby removing a major portion of liquid from the substrate surface; and removing remaining liquid from the substrate with the cellular capillary material;

wherein the cellular capillary material is a porous fluoropolymer.

15. The method of claim 14 wherein the step of removing liquid with cellular capillary material comprises contacting the substrate surface with the cellular capillary material subsequent to said lowering or raising step.

16. The method of claim 14 further comprising sealing the process tank.

17. A method of claim 14 wherein the drying vapor comprises isopropyl-alcohol.

18. The method of claim 14 further comprising draining liquid that is drawn into the cellular capillary material at atmospheric pressure.

19. The method of claim 14 wherein the liquid is de-ionized water.

20. The method of claim 14 wherein the porous flouropolymer is selected from the group consisting of PP, PTFE, and PVDF.

21. The method of claim 14 wherein the object support member comprises a core constructed of cellular capillary material and a shell constructed of non-capillary material wherein the support member comprises grooves extending through the shell and exposing the cellular core.

* * * * *

UNITED STATES PATENT AND TRADEMARK OFFICE
CERTIFICATE OF CORRECTION

PATENT NO.   : 6,907,890 B2
DATED        : June 21, 2005
INVENTOR(S)  : Lawrence Myland It is certified that error appears in the above-identified patent and that said Letters Patent is hereby corrected as shown below:

Column 10,
Line 44, after "apparatus of claim" delete "4" and add -- 1 --.

Signed and Sealed this

Thirtieth Day of August, 2005

JON W. DUDAS
*Director of the United States Patent and Trademark Office*